United States Patent
Liao

(10) Patent No.: US 8,785,303 B2
(45) Date of Patent: Jul. 22, 2014

(54) METHODS FOR DEPOSITING AMORPHOUS SILICON

(75) Inventor: Chi-Min Liao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 231 days.

(21) Appl. No.: 13/486,026

(22) Filed: Jun. 1, 2012

(65) Prior Publication Data
US 2013/0323914 A1    Dec. 5, 2013

(51) Int. Cl.
*H01L 21/36* (2006.01)
*H01L 21/20* (2006.01)
*H01L 21/67* (2006.01)
*H01L 21/3205* (2006.01)

(52) U.S. Cl.
CPC ..... *H01L 21/67207* (2013.01); *H01L 21/32055* (2013.01)
USPC ..................... 438/482; 257/E21.09

(58) Field of Classification Search
CPC ............... H01L 21/67207; H01L 21/32055
USPC ..................... 438/482; 257/E21.09
See application file for complete search history.

(56) References Cited

U.S. PATENT DOCUMENTS

| | | | |
|---|---|---|---|
| 6,099,302 A * | 8/2000 | Hong et al. | 432/259 |
| 6,635,556 B1 * | 10/2003 | Herner et al. | 438/488 |
| 6,669,750 B2 | 12/2003 | Liao et al. | |
| 6,872,636 B2 * | 3/2005 | Moriya et al. | 438/479 |
| 6,905,963 B2 * | 6/2005 | Noda et al. | 438/684 |
| 7,737,034 B2 * | 6/2010 | Ozaki et al. | 438/680 |
| 7,779,785 B2 * | 8/2010 | Miya et al. | 118/723 I |
| 8,652,258 B2 * | 2/2014 | Yokogawa et al. | 118/715 |
| 2003/0119288 A1 * | 6/2003 | Yamazaki et al. | 438/565 |

* cited by examiner

*Primary Examiner* — Luan C Thai
(74) *Attorney, Agent, or Firm* — Slater and Matsil, L.L.P.

(57) ABSTRACT

Methods for depositing an amorphous silicon layer on wafers are disclosed. A process wafer, a control wafer, and a dummy wafer may be loaded into a chamber where an amorphous silicon layer may be deposited on the process wafer. Afterwards, the process wafer and the control wafer may be removed from the chamber. The chamber and the dummy wafers are dry cleaned together. The dry cleaned dummy wafers are used in the next run for depositing amorphous silicon layer. The process may be controlled by a computer system issuing a control job comprising a first process job and a second process job, wherein the first process job is to deposit an amorphous silicon layer on the process wafer, and the second process job is to dry clean the chamber and the dummy wafer.

20 Claims, 3 Drawing Sheets

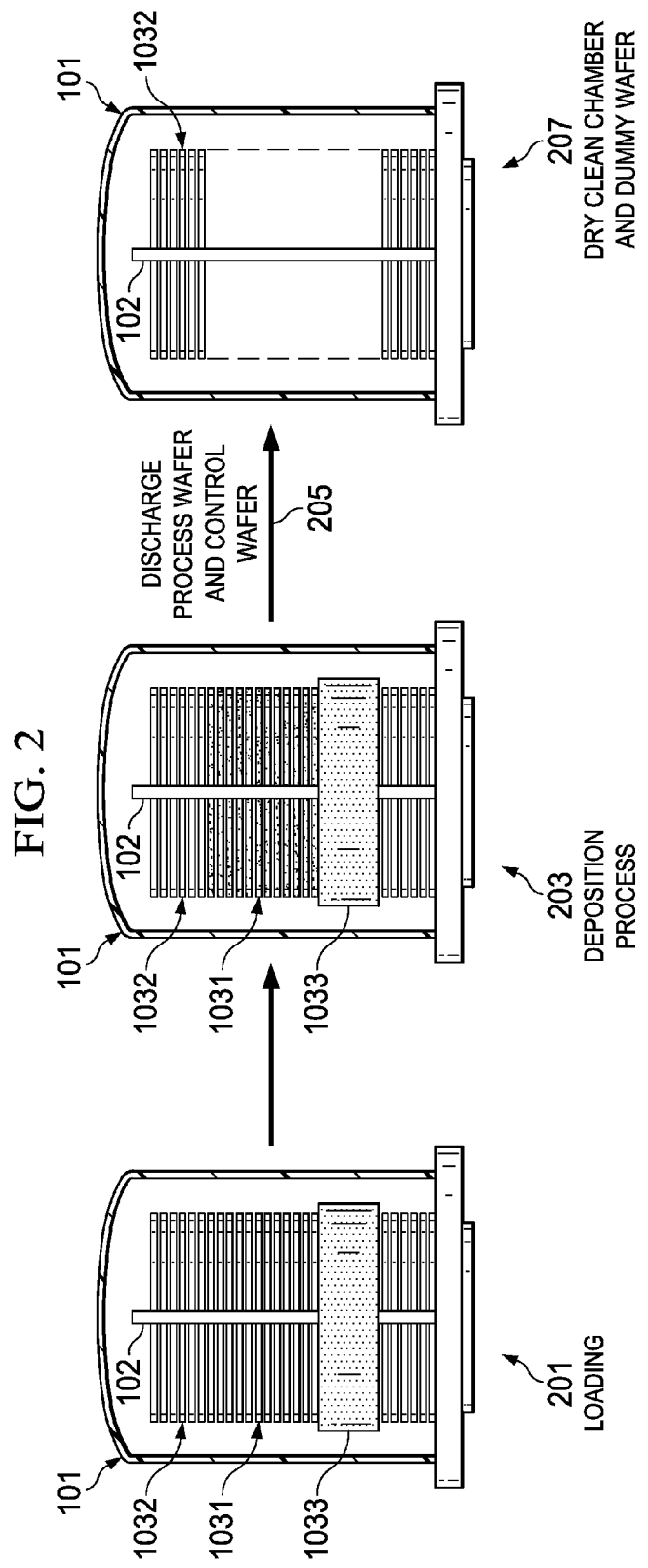

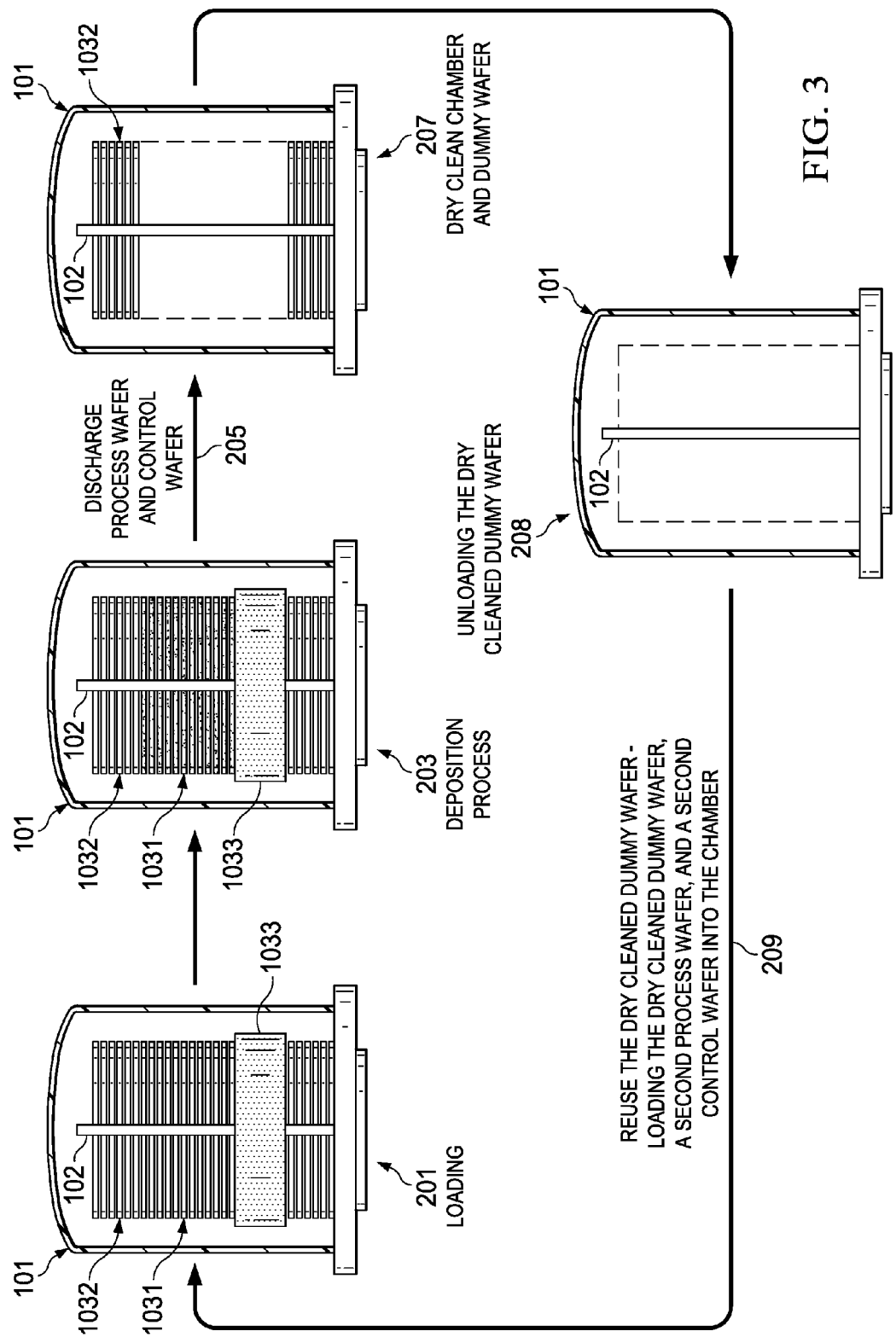

METHODS FOR DEPOSITING AMORPHOUS SILICON

BACKGROUND

Amorphous silicon is a material applied in various electronic devices such as solar cells, metal-oxide-semiconductor field-effect transistors, image sensors, and micro-electro-mechanical systems. As an example, a transistor may be formed by stacking a metal layer, an oxide layer, and a semiconductor layer together. An amorphous silicon layer can be used to form a gate structure of a transistor. The amorphous silicon gate can prevent current leakage that occurs in the conventional techniques.

An amorphous silicon layer may also be deposited on a surface of a substrate to form a crystallized silicon film. The surface of the substrate may be silicon, silicon nitride, or silicon oxide. An amorphous silicon layer may also be deposited on the surface of metal layers, such as aluminum or chromium, or an organic material such as polyimide.

An amorphous silicon layer may be formed by chemical vapor deposition (CVD) such as plasma enhanced CVD (PECVD). It may be problems in the deposition of an amorphous silicon layer to keep a stable thickness and maintain particle free for the amorphous silicon layer. Particle free amorphous silicon layer with a stable thickness can reduce the thermal stress which is the root cause of crack and peeling. Therefore there is a need to improve the stable thickness and maintain particle free in the deposition of an amorphous silicon layer.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2-3 illustrate exemplary embodiment processes of depositing an amorphous silicon layer on wafers.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
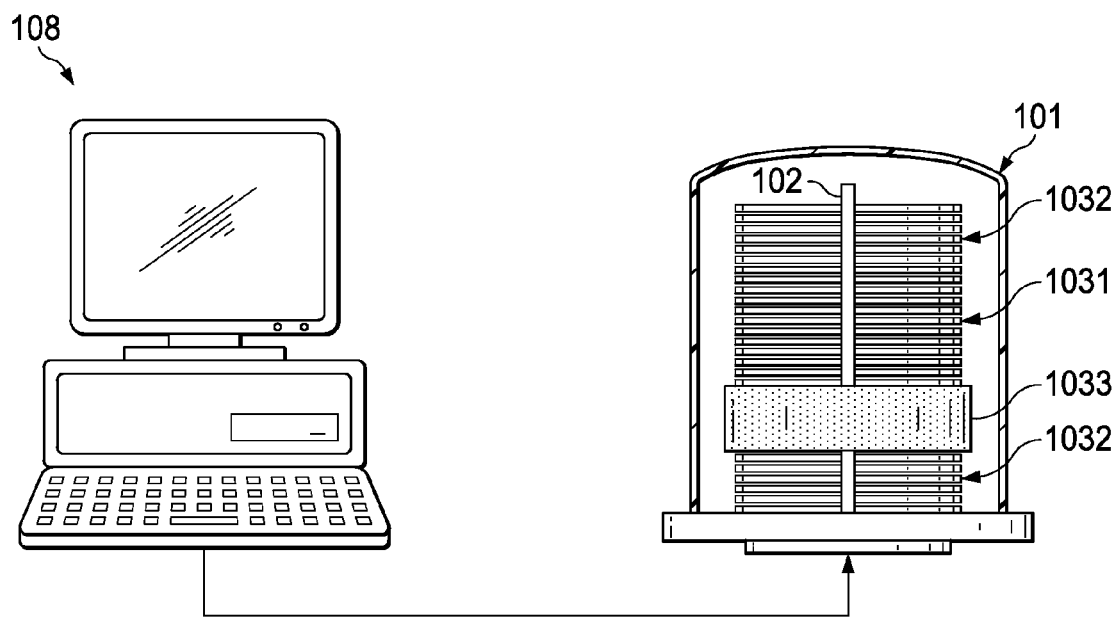
FIG. 1 illustrates a semiconductor process system of depositing an amorphous silicon layer on wafers controlled by a host computer system.

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following, methods for depositing an amorphous silicon layer are disclosed. A process wafer, a control wafer, and a dummy wafer may be loaded into a chamber where an amorphous silicon layer may be deposited on the process wafer. Afterwards, the process wafer and the control wafer may be removed from the chamber. The chamber and the dummy wafers are dry cleaned together. The dry cleaned dummy wafers can be used in the next run for depositing an amorphous silicon layer on some other process wafers, so that run-to-run deposition rate is stable for the process wafers because the accumulated amorphous silicon layer on the dummy wafer is removed by dry cleaning.

FIG. 1 illustrates a semiconductor process system of depositing an amorphous silicon layer on the surface of wafers or other substrate. A substrate is a basic unit of material on which work is performed to create a product. A substrate may be a wafer, a lead frame, a die, a flat panel display, a circuit board, a disk, etc. A wafer may be used as a representative for any other substrate. Depositing an amorphous silicon layer on the surface of wafers may be a step in a semiconductor fabrication process. Semiconductor devices are fabricated by a large number of discrete fabrication processing steps, which form a wafer flow. For example, a plurality of semiconductor devices may be fabricated on a single wafer by going through multiple fabrication processing steps such as epitaxial growth, resist development, etching, doping, etc. At the completion of the fabrication process, the wafers are tested to determine circuit functionality, and separated into individual semiconductor devices. Wafers are generally fabricated together in batches of wafers called "lots" or "runs."

As illustrated in FIG. 1, the system comprises a chamber 101 hosting various wafers such as process wafers 1031, dummy wafers 1032, and control wafers 1033. The wafers 1031, 1032, and 1033 are placed on a vertical boat 102 within the chamber 101. The system may be controlled by a host computer system 108. The system may also comprise means for conveying materials such as wafers (not shown).

The host computer 108 may be a part of a factory network and may include one or more computing devices such as personal computers, laptops, workstations, servers or any other devices. The host computer 108 may comprise a storage medium containing a program code of a software program that can perform the intended functions. The storage medium may be a floppy disk, hard disk, optical disk, magneto-optical disk, CD-ROM, CD-R, magnetic tape, nonvolatile memory card, ROM, and the like. The host computer 108 may comprise an execution unit, such as a CPU, which can read out and execute the program code stored in the storage medium. The host computer 108 may further comprise an operating system running on the computer.

The host computer 108 may perform control and communication functions in depositing an amorphous silicon layer on the surface of wafers. The host computer 108 may also perform functions in other semiconductor fabrication process steps. The host computer 108 provides recipes that control the chamber 101 and direct the wafers 1031, 1032, and 1033 through the process of depositing an amorphous silicon layer on the surface of wafers. The recipe determines what (e.g., time, temperature, etc.) occurs at each sub-step, and specifies various processing parameters such as temperature, pressure, and gas flow, which are used during the set-up and operation of the chamber 101.

The host computer 108 may instruct a convey means to convey wafers to the chamber 101 while monitoring the operation state of the chamber 101. The host computer 108 may issue instructions called a job to the chamber 101, which performs depositing an amorphous silicon layer in accordance with the instructions. The host computer 108 may issue a process job specifies a process that is to be performed on the wafers 1031, 1032, and 1033 by the chamber 101. The host computer 108 may also issue a control job that specifies a unit of work to be performed by one or more process jobs. The host computer 108 defines process jobs and control jobs based on information provided by a system user or process supervisor.

The communication between the host computer 108 and the chamber 101 may be two way. The chamber 101 may send a receipt report to the host computer 108 upon reception of the wafers conveyed by the convey means. The chamber 101 may hold job data such as process conditions and the like in files and databases in advance, and execute the processes based on the data upon reception of the job instructions from the host computer 108.

The chamber 101 may be a semiconductor furnace, which may be of the "hot wall" electric type facilitating batch processing of semiconductor wafers. The chamber 101 may be a vertical semiconductor furnace with a quartz tube which may have a polysilicon coating for a deposition process. The chamber 101 may be capable of controlling temperatures over the range of 300° C.-1200° C. to an accuracy of ±0.50° C.

The chamber 101 may comprise a wafer boat 102. The wafer boat 102 may be made of a quartz material in order to survive the extreme high process temperature. The wafer boat 102 may provide cavities for housing the wafers 1031, 1032, and 1033 therein. For instance, a plurality of wafers 1031, 1032, and 1033 are positioned in the wafer boat 102. In some embodiment, the wafer boat 102 may hold a total of 172 wafers. In some other embodiment, the wafer boat 102 may hold a total of 61 wafers. The wafers 1031, 1032, and 1033 may be eight inch wafers have a thickness of about 0.6 mm. The wafers 1031, 1032, and 1033 may be of other sizes too.

The wafer boat 102 may hold process wafers 1031 and control wafers 1033. Process wafers 1031 contain integrated circuits that eventually become the final product, or chips. Control wafers 1033 are processed independently of process wafers 1031. The control wafers 1033 may be used to measure defects introduced onto wafers during selected steps of the wafer fabrication process.

The wafer boat 102 may also hold some dummy wafers 1032. Dummy wafers 1032 may be placed at the top and at the bottom of the chamber 101, where the temperature cannot be accurately controlled. A number of dummy wafers 1032 at the top and at the bottom of the wafer boat 102 can help to achieve more accurate temperature control on the process wafers 1031 that are loaded in the center portion of the wafer boat 102.

FIG. 2 illustrates an exemplary embodiment process of depositing an amorphous silicon layer on the surfaces of wafers based on the system illustrated in FIG. 1. The process includes loading wafers into a chamber 101 in step 201, depositing an amorphous silicon layer on the wafers 1031, 1032, and 1033 in step 203, taking the process wafers 1031 and control wafers 1033 out of the chamber 101 in step 205, and finally dry cleaning the chamber 101 and the dummy wafers 1032.

At step 201, a process wafer 1031, a dummy wafer 1032, and a control wafer 1033 may be loaded onto a vertical boat 102 within the chamber 101. There may be a plurality of process wafers 1031, dummy wafers 1032, and control wafers 1033 to be loaded into the chamber 101. The dummy wafer 1032 loaded into the chamber 101 may include a silicon oxide layer. The silicon oxide layer may be in a range of 0.30 nm to 0.60 nm, which may be a result of deposition time about 5 to 25 hours. Since the incubation time is variable with the surface condition, an oxide layer on the dummy wafer surface leads to a fixed incubation time, which results in a stable deposition rate. Therefore the silicon oxide layer on the dummy wafer 1032 can keep the deposition rate of an amorphous silicon layer stable on the process wafer 1031 at step 203. The wafers 1031, 1032, and 1033 may be various sizes. There may be various numbers of wafers loaded into the chamber 101 on the boat 102 completely filling the vertical boat 102. Process wafers 1031, control wafers 1033, and dummy wafers 1032 may be loaded together or loaded separately onto the boat.

At step 203, an amorphous silicon layer is deposited on the process wafers 1031. The surface of the process wafer 1031 may include silicon, silicon nitride, silicon oxide, or another nitrides or oxides. The amorphous silicon layer may also be deposited on metal surface of the process wafers 1031, such as aluminum (Al) or chromium (Cr), or an organic material such as polyimide. The amorphous silicon layer may be deposited using silicon hydride ($SiH_4$, $Si_2H_6$, $Si_3H_8$ or $Si_4H_{10}$), or using silicon hydride and a doping gas such as PH3. The amorphous silicon layer may be deposited under a temperature in a range of about 200° C. to 500° C.

At step 205, the process wafers 1031 and the control wafers 1033 are removed from the chamber 101. The process wafers 1031 and control wafers 1033 may be removed by the conveying means not shown in FIG. 2, which have been used to load the wafers 1031 and 1033 into the chamber 101. The process wafers 1031 and control wafers 1033 may be removed by other means as well.

At step 207, the chamber 101 and the dummy wafers 1032 may be dry cleaned so that the dummy wafer 1032 becomes a dry cleaned dummy wafer 1032, where all the amorphous silicon may be completely removed from the dummy wafer 1032 by the dry cleaning while the silicon oxide layer on the dummy wafer 1032 may still be left. Dry cleaning the chamber 101 may prevent generation of particles by etching the amorphous silicon layer which can be excessively deposited on an inner wall of the chamber 101. The dry cleaning may be performed by using a fluorine-containing gas (e.g., $CF_4$, $C_2F_6$, $C_3F_8$, $CHF_3$, $NF_3$ or $SF_6$). The dry cleaning may be performed using an $F_2$ clean gas. The dry cleaning may be performed under a pressure at a value less than or equal to about 100 mTorr. The dry clean may be a plasma-based dry cleaning such as a microwave downstream-plasma process. The dry clean may be performed in other ways too. The dry cleaning may be performed at temperature at around 650° C.-850° C. The flow rate for the gas may be at about 1200 sccm to 2700 sccm. Cleaning time may be about 30 seconds to 2 minutes. The dry cleaning may be controlled by a computer system as the computer system 108 shown in FIG. 1, with a dry cleaning recipe. The dry cleaning will remove the amorphous silicon layer which is excessively deposited on an inner wall of the chamber 101 and on the dummy wafer 1032, while leaving the silicon oxide layer on the dummy wafer 1032.

The process shown in FIG. 2 including step 201 to step 207 may be controlled by a computer system such as the host computer system 108 illustrated in FIG. 1. The computer system 108 may issue a control job comprising a first process job and a second process job, wherein the first process job is to deposit the amorphous silicon layer on the process wafers 1031, and the second process job is to dry clean the chamber 101 and the dummy wafers 1032. A first recipe may be used by the computer system 108 to control depositing the amorphous silicon layer, and a second recipe may be used by the computer system 108 to control dry cleaning the chamber 101 and the dummy wafers 1032. The computer system 108 selects a dry cleaning recipe and executes the dry cleaning recipe for dry cleaning the chamber 101 and the dummy wafer 1032.

As illustrated in FIG. 3, the dry cleaned chamber 101 and dummy wafers 1032 are used in the next run of wafers to deposit an amorphous silicon layer, as illustrated in step 209. It may be possible that the dummy wafers 1032 are kept in the chamber 101 for reuse in the next run. It also may be possible that the dummy wafers 1032 are unloaded first in step 208. Then in step 209, the dry cleaned dummy wafer 1032, together with a second process wafer 1031, and a second control wafer 1033 are loaded into the chamber 201 in step 209. The loading of the dry cleaned dummy wafer 1032, the second process wafer 1031, and the second control wafer 1033 may be done at the same time, or done separately in different steps. They are shown in FIG. 3 as step 209 or step 201, depending on the actual implementation. The dry cleaned dummy wafers 1032 can keep the run-to-run deposition rate to be stable for the process wafers 1031 because the accumulated amorphous silicon layer on the dummy wafer 1032 is removed. The dummy wafer 1032 loaded into the chamber may still include the silicon oxide layer it had before the dry clean. In the next run, a second process wafer 1031 and a second control wafer 1033 may be loaded into the chamber 101, which contains the dry cleaned dummy wafer 1032, as shown in step 201. An amorphous silicon layer may be deposited on the second process wafer 1031 at step 203. Afterwards, the second process wafer 1031 and the second control wafer 1033 may be removed from the chamber 101 at step 205; and finally the chamber 101 and the dummy wafer 1032 are dry cleaned again. There may be a plurality of process wafers 1031 and control wafers 1033 as illustrated in the process in FIG. 3.

A method for depositing a layer on a process wafer is disclosed. The method comprises: loading into a chamber a process wafer, a control wafer, and a dummy wafer; depositing an amorphous silicon layer on the process wafer; removing the process wafer and the control wafer from the chamber; and dry cleaning the chamber and the dummy wafer. The method may further comprise: loading the dry cleaned dummy wafer, a second process wafer, and a second control wafer into the chamber; depositing an amorphous silicon layer on the second process wafer; removing the second process wafer and the second control wafer from the chamber; and dry cleaning the chamber and the dry cleaned dummy wafer.

A method for depositing an amorphous silicon layer is disclosed. The method comprises: loading into a chamber a process wafer, a control wafer, and a dummy wafer; depositing an amorphous silicon layer on the process wafer; removing the process wafer and the control wafer from the chamber; dry cleaning the chamber and the dummy wafer; loading a second process wafer, and a second control wafer into the chamber; depositing an amorphous silicon layer on the second process wafer; removing the second process wafer and the second control wafer from the chamber; and dry cleaning the chamber and the dry cleaned dummy wafer.

A method for depositing an amorphous silicon layer is disclosed. The method comprises: loading into a chamber a process wafer, a control wafer, and a dummy wafer; issuing by a computer system a control job comprising a first process job and a second process job, wherein the first process job is to deposit an amorphous silicon layer on the process wafer, and the second process job is to dry clean the chamber and the dummy wafer; depositing an amorphous silicon layer on the process wafer according to the first process job; removing the process wafer and the control wafer from the chamber; and dry cleaning the chamber and the dummy wafer according to the second process job.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for depositing a layer, comprising:
   loading into a chamber a process wafer, a control wafer, and a dummy wafer, the dummy wafer including a silicon oxide layer;
   depositing an amorphous silicon layer on the process wafer;
   removing the process wafer and the control wafer from the chamber; and
   dry cleaning the chamber and the dummy wafer.

2. The method of claim 1, wherein the amorphous silicon layer is deposited using silicon hydride.

3. The method of claim 1, wherein dry cleaning is performed using an $F_2$ clean gas.

4. The method of claim 1, wherein dry cleaning is performed under a pressure at a value less than or equal to about 100 mTorr.

5. The method of claim 1, wherein the method is controlled by a computer system.

6. The method of claim 5, wherein a first recipe is used by the computer system to control depositing the amorphous silicon layer, and a second recipe is used by the computer system to control dry cleaning the chamber and the dummy wafer.

7. The method of claim 6, wherein the computer system selects a dry cleaning recipe and executes the dry cleaning recipe for dry cleaning the chamber and the dummy wafer.

8. The method of claim 1, further comprising loading the dummy wafer, the process wafer, and the control wafer onto a vertical boat.

9. The method of claim 8, wherein a plurality of dummy wafers, a plurality of process wafers, and a plurality of control wafers are loaded onto the vertical boat completely filling the vertical boat.

10. The method of claim 1, wherein the amorphous silicon layer is deposited using silicon hydride and a doping gas.

11. The method of claim 1, wherein the amorphous silicon layer is deposited under a temperature in a range of about 200° C. to 500° C.

12. The method of claim 1, further comprising:
    loading the dry cleaned dummy wafer, a second process wafer, and a second control wafer into the chamber;
    depositing an amorphous silicon layer on the second process wafer;
    removing the second process wafer and the second control wafer from the chamber; and
    dry cleaning the chamber and the dry cleaned dummy wafer.

13. A method for depositing an amorphous silicon layer, comprising:
- loading into a chamber a process wafer, a control wafer, and a dummy wafer, the dummy wafer including a silicon oxide layer;
- depositing an amorphous silicon layer on the process wafer;
- removing the process wafer and the control wafer from the chamber;
- dry cleaning the chamber and the dummy wafer;
- loading a second process wafer, and a second control wafer into the chamber;
- depositing an amorphous silicon layer on the second process wafer;
- removing the second process wafer and the second control wafer from the chamber; and
- dry cleaning the chamber and the dry cleaned dummy wafer.

14. The method of claim 13, wherein dry cleaning is performed using an $F_2$ clean gas.

15. The method of claim 13, wherein dry cleaning is performed under a pressure at a value less than or equal to about 100 mTorr.

16. The method of claim 13, wherein the method is controlled by a computer system, a first recipe is used by the computer system to control depositing the amorphous silicon layer, and a second recipe is used by the computer system to control dry cleaning the chamber containing the dummy wafer.

17. The method of claim 13, wherein the dummy wafer, the process wafer, and the control wafer are loaded onto a vertical boat within the chamber.

18. The method of claim 1, wherein the amorphous silicon layer is deposited using silicon hydride.

19. The method of claim 1, wherein the amorphous silicon layer is deposited under a temperature in a range of about 200° C. to 500° C.

20. A method for depositing an amorphous silicon layer, comprising:
- loading into a chamber a process wafer, a control wafer, and a dummy wafer, the dummy wafer including a silicon oxide layer;
- issuing by a computer system a control job comprising a first process job and a second process job, wherein the first process job is to deposit an amorphous silicon layer on the process wafer, and the second process job is to dry clean the chamber and the dummy wafer;
- depositing an amorphous silicon layer on the process wafer according to the first process job;
- removing the process wafer and the control wafer from the chamber; and
- dry cleaning the chamber and the dummy wafer according to the second process job.

* * * * *